(12) United States Patent
Park et al.

(10) Patent No.: US 7,501,618 B2
(45) Date of Patent: Mar. 10, 2009

(54) DEFORMATION METHOD OF NANOMETER SCALE MATERIAL USING PARTICLE BEAM AND NANO TOOL THEREBY

(75) Inventors: Byong-Chon Park, Daejeon (KR); Ki-Young Jung, Seoul (KR); Sang-Jung Ahn, Daejeon (KR); Dal-Hyun Kim, Daejeon (KR); Jinho Choi, Daejeon (KR); Jae-Wan Hong, Seoul (KR)

(73) Assignee: Korea Research Institute of Standards, Daejeon (KR)

( * ) Notice: Subject to any disclaimer, the term of this patent is extended or adjusted under 35 U.S.C. 154(b) by 200 days.

(21) Appl. No.: 11/678,681

(22) Filed: Feb. 26, 2007

(65) Prior Publication Data

US 2008/0203295 A1    Aug. 28, 2008

(51) Int. Cl.
*G01N 23/00* (2006.01)
*G01N 23/02* (2006.01)
(52) U.S. Cl. .................. 250/251; 250/307; 250/306; 250/492.1; 250/492.2
(58) Field of Classification Search ............... 250/251, 250/306, 307, 492.1, 492.2
See application file for complete search history.

(56) References Cited

U.S. PATENT DOCUMENTS

2002/0021428 A1* 2/2002 Nakano et al. ............... 355/53

FOREIGN PATENT DOCUMENTS

WO    WO 2006/011714 A1    2/2006

OTHER PUBLICATIONS

Park, et al. "Ion Beam Bending of Nano Scale Materials in Free Space," Japanese Journal of Applied Physics, 2006, pp. L1162-L1164, vol. 45, No. 43, Nanofous Inc., Seoul, Korea.

* cited by examiner

*Primary Examiner*—Nikita Wells
(74) *Attorney, Agent, or Firm*—Antonelli, Terry, Stout & Kraus, LLP.

(57) ABSTRACT

The present invention relates to a deformation method of nanometer-scale material using a particle beam and a nano-tool thereby. The deformation method of the nanometer-scale material using the particle beam according to the present invention is characterized in that the nanometer-scale material is bent toward a direction of the particle beam by irradiating the particle beam on the nanometer-scale material.

12 Claims, 12 Drawing Sheets

DEFORMATION METHOD OF NANOMETER SCALE MATERIAL USING PARTICLE BEAM AND NANO TOOL THEREBY

BACKGROUND OF THE INVENTION

1. Field of the Invention

The present invention relates to a deformation method of nanometer-scale material using particle beam and a nano-tool thereby.

2. Description of the Related Art

A generally used method of deforming a material is to apply a mechanical force. The material applied with the mechanical force has a permanent deformation over a certain degree of mechanical strength.

However, in case where the scale of the material is below nanometer-scale, it is not a convenient job no more to deform the material by applying the mechanical force due to the miniscule scale of the material. Besides, even if there exists a method of deforming the nanometer-scale material using the mechanical force, such as pressing the nanometer-scale material against the ground, it is nearly impossible to deform the nanometer-scale material with desired degree and shape of deformation. It is due not only to the fact that it is not easy to control the mechanical force required for deforming the nanometer-scale material, but also to the fact that there may be an another mechanism affecting the deformation of the material in the nanometer-scale environment.

As described above, as it is very difficult to deform the nanometer-scale material, they have been using methods such as milling, etching, or deposition in order to control the shape of the material in nanometer-scale or micron-scale.

Accordingly, if it is devised to provide a new method of deforming the nanometer-scale material, which is completely different from the above-mentioned conventional methods such as milling, etching, and deposition, the new method may be utilized in manufacturing nano-tools having various shapes by deforming the nanometer-scale material according to such a method.

SUMMARY OF THE INVENTION

Accordingly, it is an aspect of the present invention to provide a deformation method of nanometer-scale material using particle beam and a nano-tool thereby.

Additional aspects and advantages of the invention will be set forth in part in the description which follows and, in part, will be obvious from the description, or may be learned by practice of the invention.

The foregoing and other aspects of the present invention are achieved by providing a deformation method of nanometer-scale material using particle beam, which is characterized in that the nanometer-scale material is bent toward a direction of the particle beam by irradiating the particle beam on the nanometer-scale material.

BRIEF DESCRIPTION OF THE DRAWINGS

These and/or other aspects and advantages of the present invention will become apparent and more readily appreciated from the following description of the aspects, taken in conjunction with the accompany drawings of which.

DETAILED DESCRIPTION OF THE PREFERRED EMBODIMENTS

Reference will now be made in detail to the aspects of the present invention, examples of which are illustrated in the accompanying drawings, wherein like reference numerals refer to like elements throughout. The aspects are described below in order to explain the present invention by referring to the figures.

It is an objective of the present invention to provide a deformation method of nanometer-scale material.

It is an another objective of the present invention to provide a nano-tool manufactured according to the deformation method of nanometer-scale material.

An objective of the present invention may be achieved by providing a deformation method of a nanometer-scale material using a particle beam which is characterized in that the nanometer-scale material is bent toward a direction of the particle beam by irradiating the particle beam on the nanometer-scale material.

The particle beam may be one of neutron beam, proton beam, neutral atom beam, and ion beam. Herein, the kind of the neutral atom or ion may include, as an example, Helium (He), Boron(B), Neon(Ne), Magnesium(Mg), Aluminum (Al), Silicon(Si), Phosphor(P), Chlorine(Cl), Argon(Ar), Titanium(Ti), Chrome(Cr), Gallium(Ga), Germanium(Ge), Krypton(Kr), Indium(In), Xenon(Xe), Aurum(Au), and Platinum(Pt), etc.

It is preferable that the thickness or the diameter of a portion of the nanometer-scale material where the particle beam is irradiated on should be below 200 nm. Also, the kind of the nanometer-scale material irradiated with the particle beam may include conductor, semiconductor, and insulator.

Also, the shape of the nanometer-scale material deformed by the particle beam may take various shapes with protrusions such as bar, spike, and tower.

In addition, it is also possible to irradiate the particle beam after screening a certain portion of the bar or the protrusion with a mask, so that a remaining portion of the protrusion exposed out of the mask may be bent toward the direction of the particle beam.

Hereinbelow, a deformation method of nanometer-scale material using a particle beam and embodiments of a nano-tool thereby according to the present invention will be explained in reference with the attached drawings.

The deformation method of nanometer-scale material using the particle beam according to the present invention is based on a latest experimental discovery that nanometer-scale material would be bent toward a direction of a particle beam as the particle beam is irradiated on the nanometer-scale material.

An application field of a conventional particle beam, particularly, a focused ion beam has been limited to milling, etching, and deposition for micro-machining. That is, the application of the conventional focused ion beam has been limited to milling, etching of material subjected as a specimen by impacting the material subjected as the specimen using acceleration energy, and to deposition which fixes the ion beam on the material subjected as the specimen.

An example of the milling using the ion beam may be a process of producing a specimen for a transmission electron microscope. An example of the etching may be lithography of a semiconductor chip. Also, an example of the deposition may be recovery of micro component circuit.

The deformation method of the nanometer-scale material using the particle beam according to the present invention is based on the latest experimental discovery which is completely different from the conventional milling, etching, and deposition.

Figure 1:
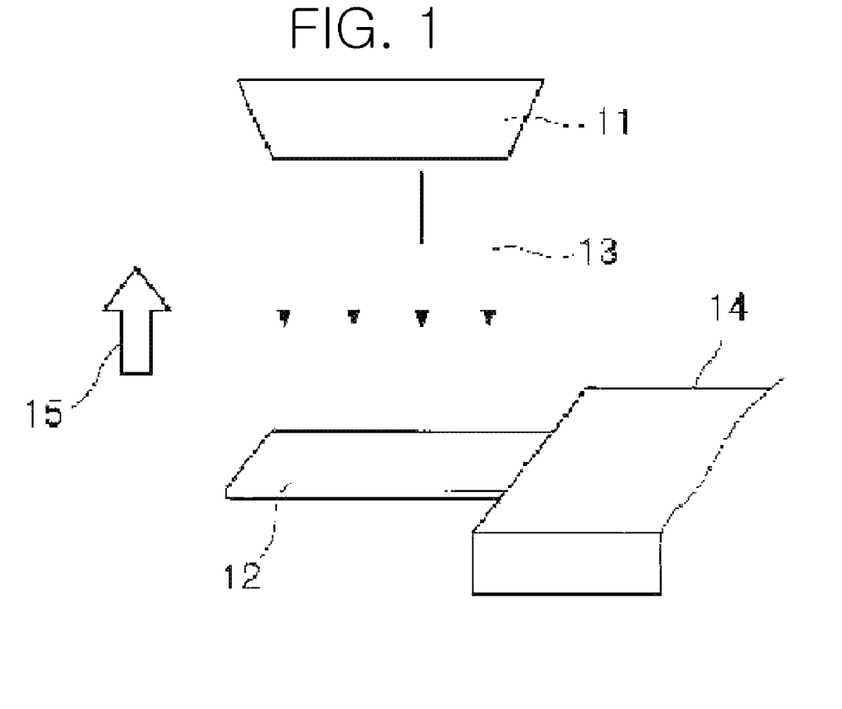
FIG. 1 schematically illustrates an apparatus for implementing a deformation method of nanometer-scale material using a particle beam according to an embodiment of the present invention.

FIG. 1 schematically illustrates an apparatus for implementing a deformation method of nanometer-scale material using a particle beam according to an embodiment of the present invention.

As shown in FIG. 1, a specimen 12 in shape of a bar having a nanometer-scale thickness is prepared and fixed on a fixing device 14. After the specimen 12 is fixed, an ion beam 13 is irradiated on the specimen 12 through an ion column 11, so that the specimen 12 is bent toward a direction of the ion beam 13. That is, the specimen 12 gets being bent toward a direction of an arrow mark 15 indicated in FIG. 1.

FIGS. 2A through 2E are photographs of a scanning electron microscope (SEM) showing results of experiments implemented according to the method shown in FIG. 1.

The experiment was implemented in a focused ion beam (FIB) system. The kind of the employed ion beam was gallium.

Figure 2A:
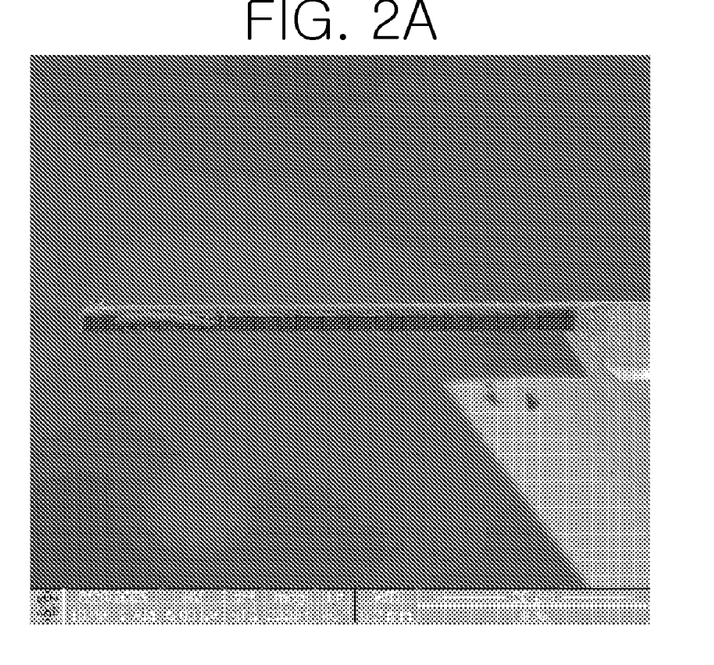
FIGS. 2A through 2E are SEM photographs showing results of experiments implemented with a silicon bar according to the deformation method shown in FIG. 1.

The SEM photograph shown in FIG. 2A is a photograph showing a state before the ion beam was irradiated. The specimen employed in the experiment of FIG. 2A was silicon (Si). An initial specimen to be irradiated with the ion beam has a length of 30 µm, a width of 10 µm, and a thickness of 4 µm. The focused ion beam emitted by the FIB system was irradiated in a direction perpendicular to the specimen from upside of the specimen, as shown in FIG. 1.

Figure 2B:
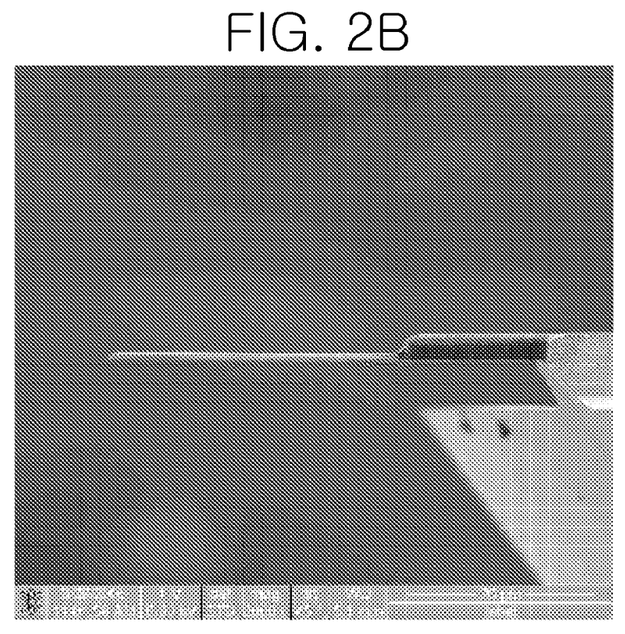

According to the experiment implemented by the inventor of the present invention, in case that the ion beam is irradiated on a specimen having a thick thickness, the thickness of the specimen irradiated with the ion beam gets thinner due to the sputtering effect. FIG. 2B illustrates an SEM photograph showing a specimen being thinner in such a manner.

Figure 2C:
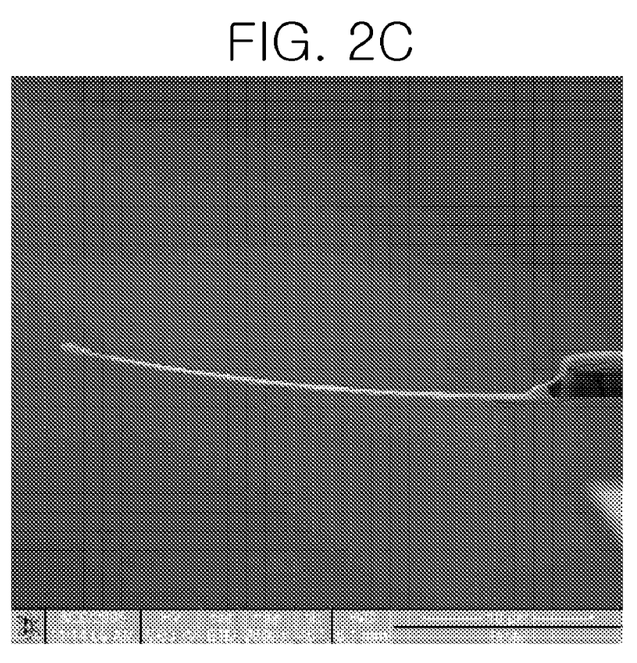

If the thickness of the specimen gets close to a threshold thickness due to the sputtering effect by the ion beam, the specimen is bent toward the direction of the ion beam. FIG. 2C illustrates an SEM photograph showing a specimen beginning to bend by irradiation of the ion beam.

According to the result of the experiment by the inventor of the present invention, the threshold thickness where the specimen begins to bend is approximately 200 nm. That is, as the specimen becomes gradually thinner by the sputtering effect by the ion beam, the specimen gets bent toward the direction of the ion beam approximately at the thickness of 200 nm.

Figure 2D:
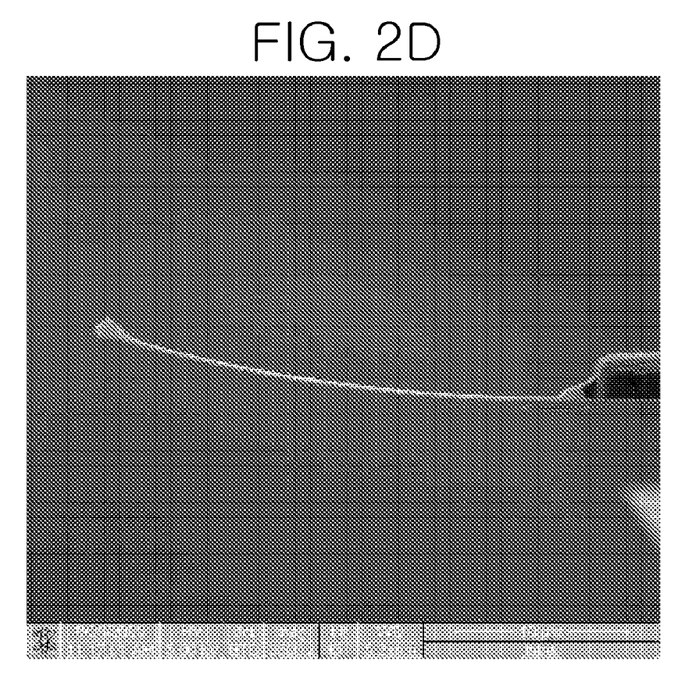
Figure 2E:
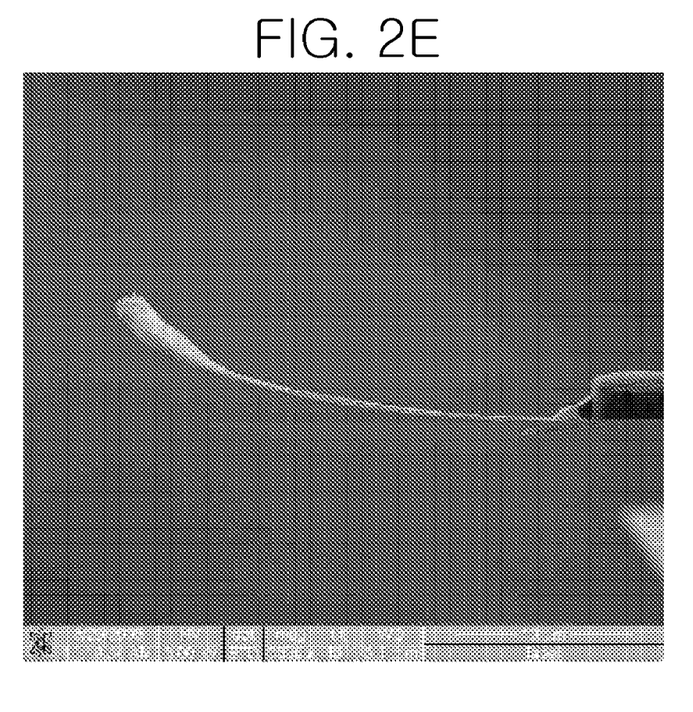

FIGS. 2D and 2E illustrate SEM photographs showing a specimen further irradiated with the ion beam. As shown in the SEM photographs of FIGS. 2D and 2E, it can be clearly identified that the silicon specimen in shape of a bar is bent toward the direction of the ion beam.

Figure 3:
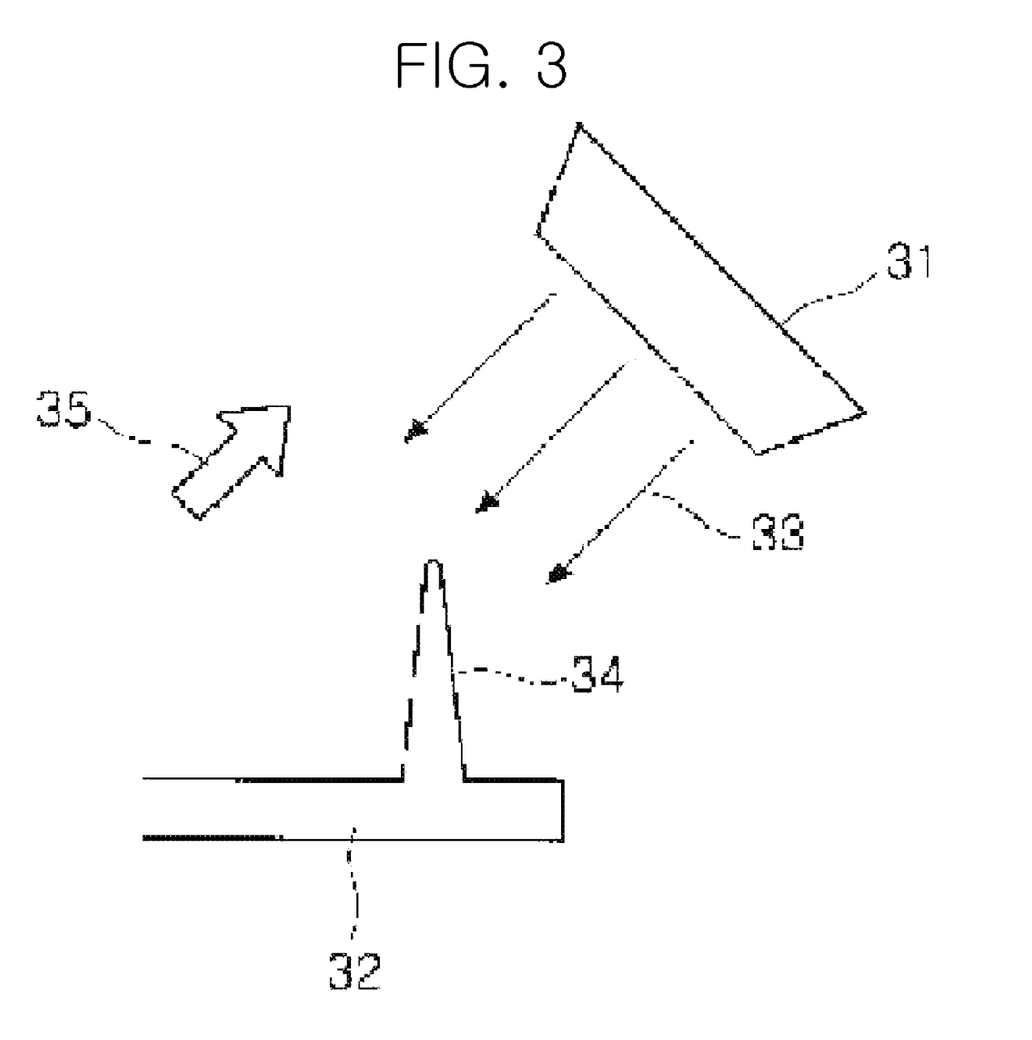
FIG. 3 illustrates schematically an another apparatus for implementing a deformation method of nanometer-scale material using the particle beam according to an another embodiment of the present invention.

FIG. 3 illustrates schematically an another apparatus for implementing the deformation method of nanometer-scale material using the particle beam according to an another embodiment of the present invention. Meanwhile FIG. 2 shows how to implement the deformation method of nanometer-scale material having a shape of a bar, FIG. 3 illustrates an apparatus for implementing a deformation method of a nanometer-scale material having a shape of a protrusion such as a spike or a tower.

In reference with FIG. 3, a specimen 32 in shape of a protrusion with a nanometer-scale diameter is prepared, in the same manner shown in FIG. 1. After the specimen 32 is prepared, an ion beam 33 is irradiated on a protruding portion 34 of the specimen 32 through an ion column 31. As the ion beam is irradiated on the protruding portion 34 of the specimen 32, the protruding portion 34 of the specimen 32 gets bent toward a direction of the ion beam 33. That is, the protruding portion 34 of the specimen 32 is bent toward a direction of an arrow mark 35 indicated in FIG. 3.

Figure 4A:
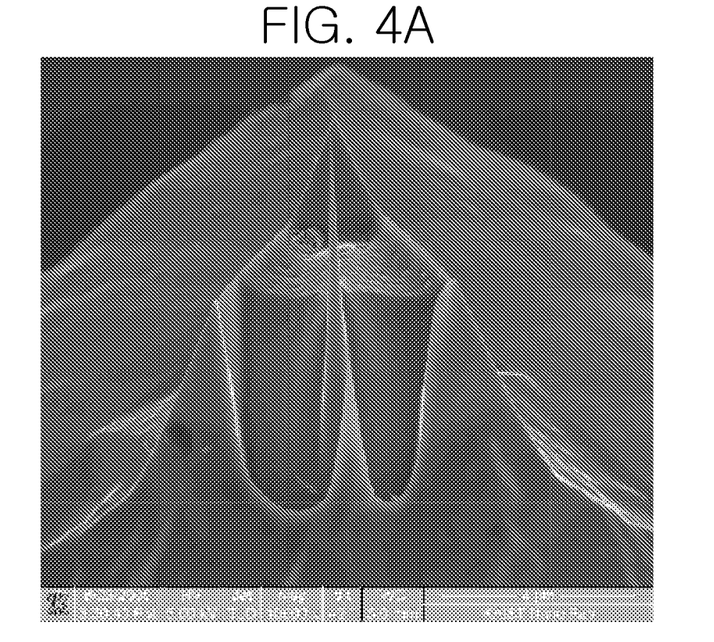
FIGS. 4A and 4B are SEM photographs showing results of experiments implemented with nanometer-scale material having a shape of a silicon spike according to the deformation method shown in FIG. 3.
Figure 4B:
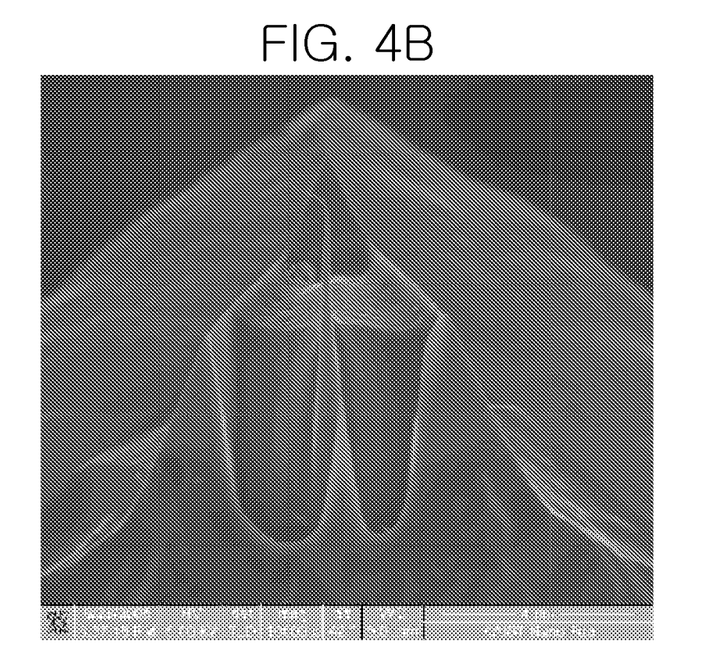

FIGS. 4A and 4B are SEM photographs showing results of experiments implemented according to the method shown in FIG. 3. FIG. 4A is an SEM photograph of a specimen before the ion beam is irradiated, while FIG. 4B is an SEM photograph of a specimen after the ion beam is irradiated.

The ion beam is irradiated from left side of the photograph with an angle of 52 degree. By comparing FIG. 4A and FIG. 4B, it may be clearly identified that the protruding portion in shape of a spike is bent toward the direction of the ion beam.

The material constituting the specimen used in FIG. 4 is silicon doped with Stibium(Sb). The protruding portion has the height of approximately b 2.5 µm, and the diameter of 15 nm measured on an end thereof. As shown in FIG. 4B, it is can be identified that a tip ranging up to 1 µm from the end of the protruding portion is bent the direction of the ion beam.

Figure 5:
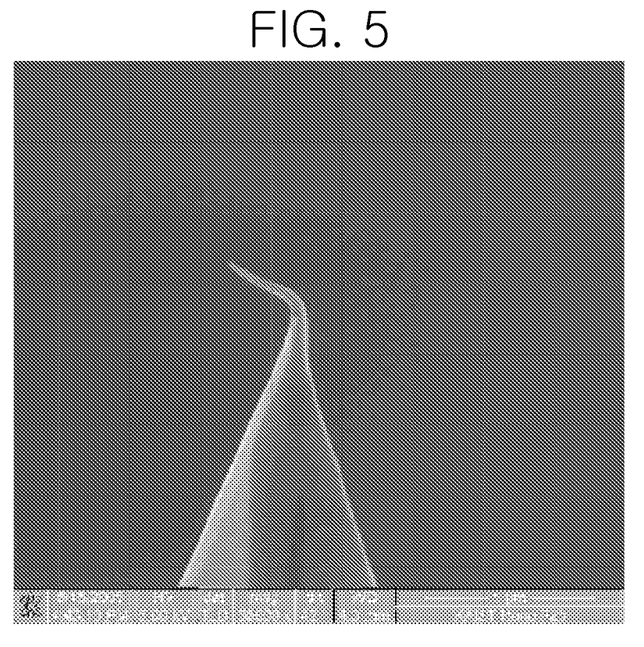
FIGS. 5 through 8 are SEM photographs showing results of results of experiments implemented with nanometer-scale materials having various shapes and materials according to the deformation method shown in FIG. 3.
Figure 6:
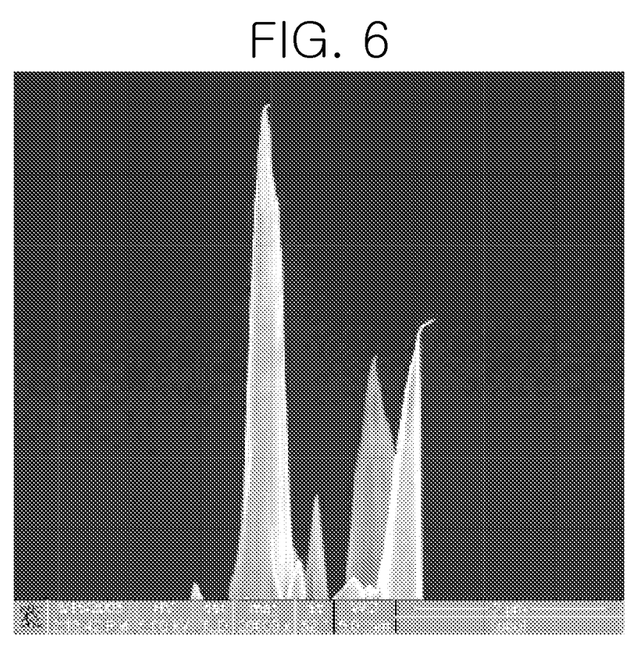

FIGS. 5 and 6 are SEM photographs after the ion beam is irradiated on the specimen made of different material. The material constituting the specimen shown in FIG. 5 is amorphous carbon, while the material constituting the specimen shown in FIG. 6 is tungsten. As shown in photographs of FIGS. 5 and 6, it is identified that tips of protruding portions are bent toward the direction of the ion beam.

Figure 7:
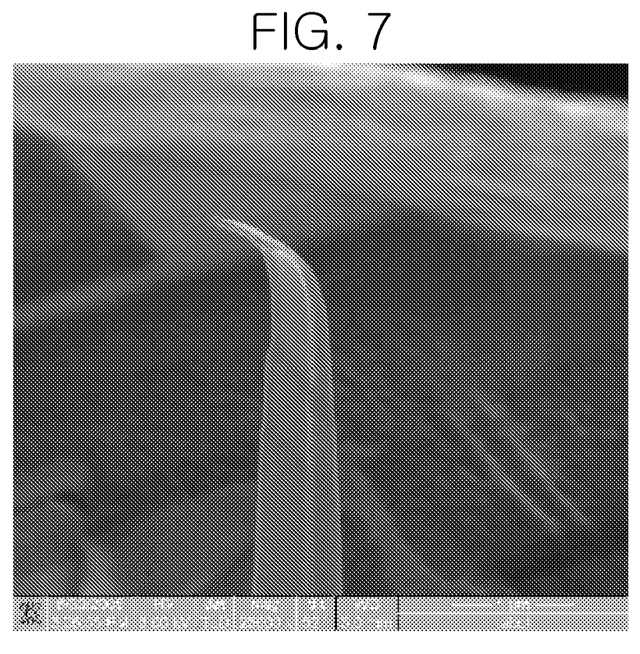
Figure 8:
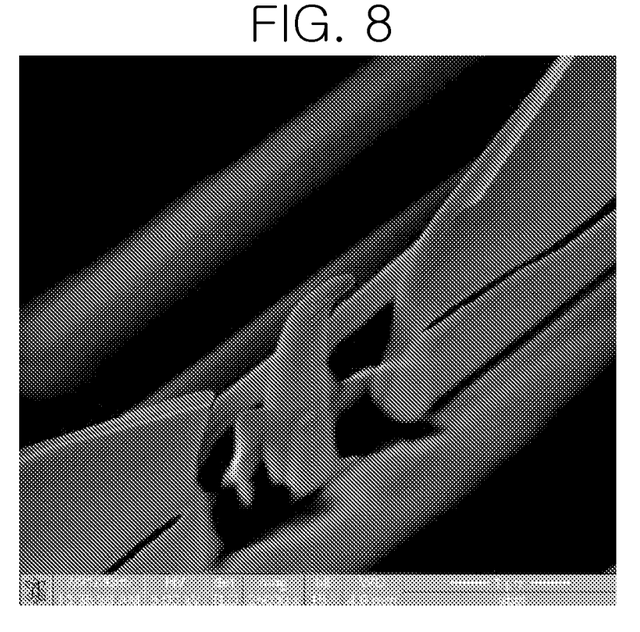

FIGS. 7 and 8 are SEM photographs after the ion beam is irradiated on the specimen in shape of tower. The kind of material constituting specimen shown in FIG. 7 is silicon, while the kind of material constituting specimen shown in FIG. 8 is silicon nitride. As shown in FIG. 8, it can be identified that a portion being separated and protruding in the middle is bent.

With results from a series of such experiments, the inventor of the present invention concluded that the nanometer-scale material has a tendency to be bent toward the direction of the particle beam by the irradiated particle beam regardless of the conductive property of the material, that is, regardless of whether the material is conductor(tungsten), semiconductor (silicon), or insulator(silicon nitride), in case when the size of the material becomes so small to be in nanometer-scale. Such a result is a new experimental fact that has not been known so far.

The deformation method of nanometer-scale material using the particle beam according to the present invention based on such a new experimental fact can deform the nanometer-scale material not by an electric, magnetic, or chemical means or apparatus, but simply by irradiating the particle beam. Also, the deformation method of nanometer-scale material using the particle beam according to the present invention can be applied to any material when the size of the material becomes smaller than a particular threshold value of measurement, regardless of the geometry of the nanometer-scale material.

The inventor of the present invention concluded that such an experimental phenomenon is caused by the stress gradient which occurs when particles of the particle beam is implanted into the nanometer-scale material.

That is, as the particle beam is irradiated on the nanometer-scale material, the particles (or, Ga ion in the present experiment) constituting the particle beam is implanted into the material on which the particle beam is irradiated, which causes the lattice defect. The inventor of the present invention concluded that the lattice defect and the implanted particle do not have constant concentration inside the material, but have higher concentration on the other side of a front side, where the ion beam is irradiated on, than concentration on the front side. Also, as the amount of the compressive stress is generally proportional to the concentration of the implanted particles and the lattice defect, the inventor of the present invention concluded that the nanometer-scale material irradiated with the particle beam is bent toward the direction of the particle beam by difference of the compressive stress.

Also, as shown in the photographs in FIG. 2, although the sputtering effect is prevalent in the micron-scale, if thickness of the bar gets thinner to be in the nanometer-scale, the bar is bent by the compressive stress. With deriving such fact, the inventor of the present invention concluded that the size of the material irradiated with the particle beam has to dwindle from micron-scale to nanometer-scale in order to cause such a bending effect by the compressive stress. Also, it is identified that thickness required for the material to be bent is approximately 200 nm.

Figure 9:
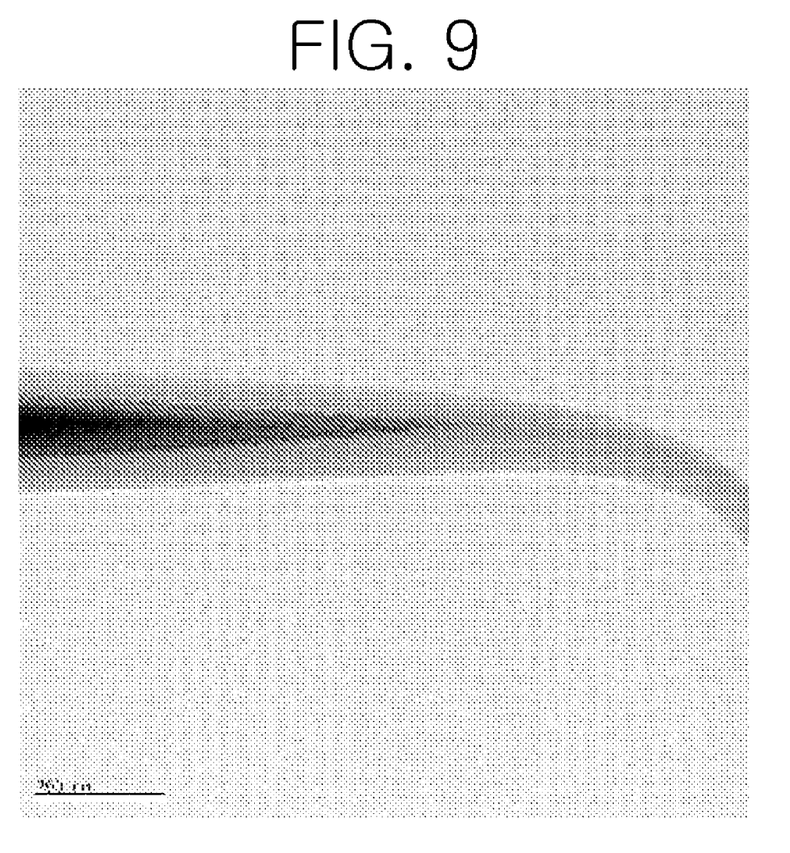
FIG. 9 is a TEM photograph of a silicon spike bent by the particle beam.

FIG. 9 is a photograph of transmission electron microscope (TEM) of a silicon spike bent by the focused ion beam. The dark area shown in FIG. 9 indicates a crystal area where the ion of the ion beam is not implanted, while the grey area indicates an area where transformed into an amorphous phase as the ion of the ion beam is implanted. The TEM photograph in FIG. 9 may be an evidence supporting the present inventor's conclusion of the present invention.

The deformation method of the nanometer-scale material according to the present invention is implemented using gallium ion beam. However, as it is the compressive stress that causes deformation of the nanometer-scale material, other kinds of ion beam may be employed too, such as a neutron beam, a proton beam, and a neutral-atom beam. Meanwhile, source of the particle beam usable in the deformation of the nanometer-scale material may include, as an example, Helium(He), Boron(B), Neon(Ne), Magnesium(Mg), Aluminum (Al), Silicon(Si), Phosphor(P), Chlorine(Cl), Argon(Ar), Titanium(Ti), Chrome(Cr), Gallium(Ga), Germanium(Ge), Krypton(Kr), Indium(In), Xenon(Xe), Aurum(Au), and Platinum(Pt), etc.

Because the deformation method of the nanometer-scale material using the particle beam according to the present invention does not employ a method of applying physical force to the nanometer-scale material in order to deform the nanometer-scale material, the deformation method according to the present invention makes it possible to manufacture a nano-tool by shaping the nanometer-scale material into various shapes as while adjusting the amount or the direction of the particle beam irradiated on the nanometer-scale material.

An example of the nano-tool manufactured by the deformation method of the nanometer-scale material using the particle beam according to the present invention is a critical dimension scanning probe microscope probe(CD-SPM).

Figure 10:
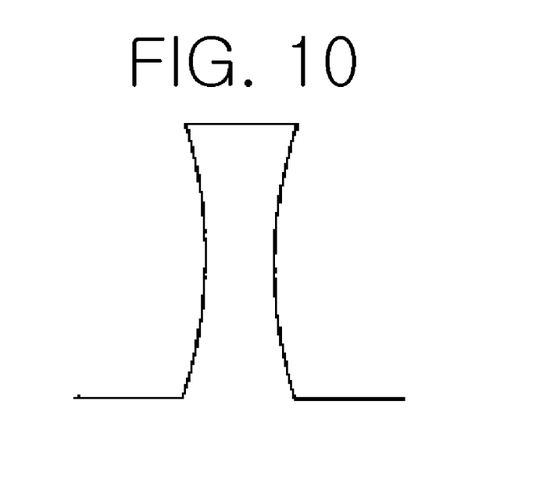
FIG. 10 is a schematic diagram of a structure having a nanometer-scale curvature.

In case of scanning an image of a side wall having a curvature as shown in FIG. 10 using the SPM, it would be impossible to scan the image of the side wall having a curvature precisely with a probe having a straight tip. Accordingly, a probe having a bent tip is preferable for such case. Such a probe for scanning an image of a side wall having a curvature using an SPM is called a CD-SPM probe. However, the CD-SPM probe may be manufactured by bending a tip of the probe easily by employing the deformation method of the nanometer-scale material using the particle beam according to the present invention.

Figure 11:
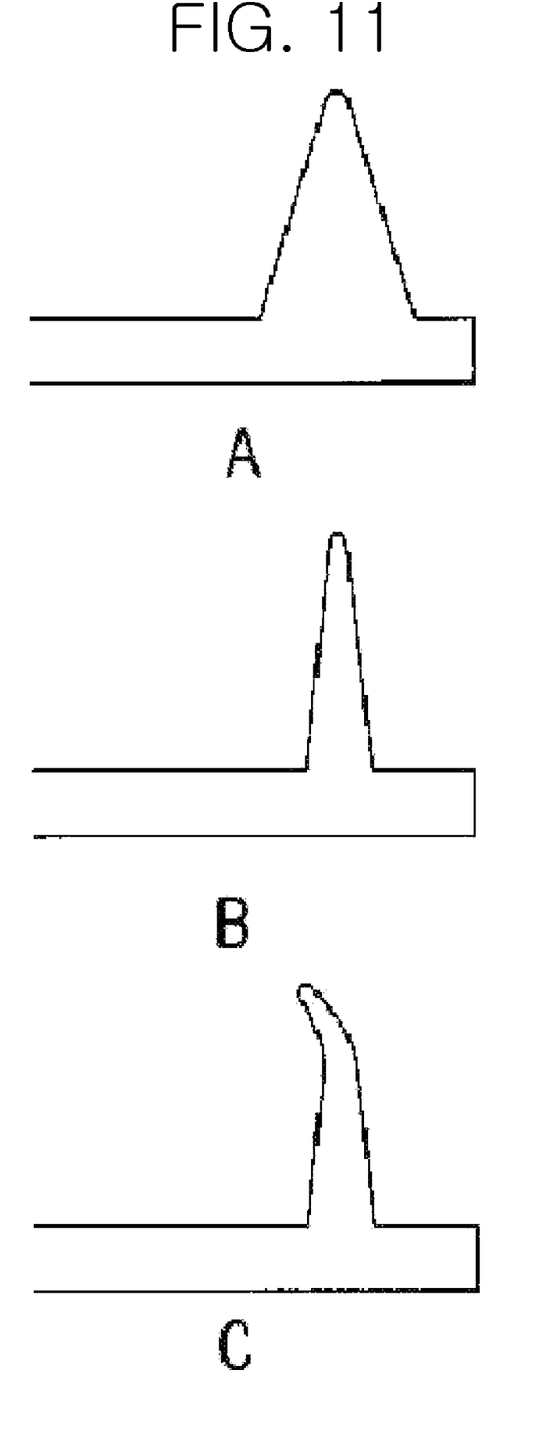
FIG. 11 schematically illustrates a process of manufacturing a CD-SPM probe by employing the deformation method of the nanometer-scale material using the particle beam according to an embodiment of the present invention.

FIG. 11 is an example of a CD-SPM probe manufactured using the deformation method of the nanometer-scale material using the particle beam according to an embodiment of the present invention.

FIG. 11A illustrates schematically a conventional SPM probe, particularly, atomic force microscope(AFM) probe. FIG. 11B illustrates schematically a tip of the probe being thin enough by ion milling. The probe as shown in FIG. 11B is commercially available today. FIG. 11C illustrates a tip of the probe after the particle beam is irradiated on the tip by the deformation method of the nanometer-scale material using the particle beam according to the present invention. As shown in the drawings, the tip of the probe can be bent to a desired direction by adjusting properly a direction of irradiation of the particle beam.

Figure 12:
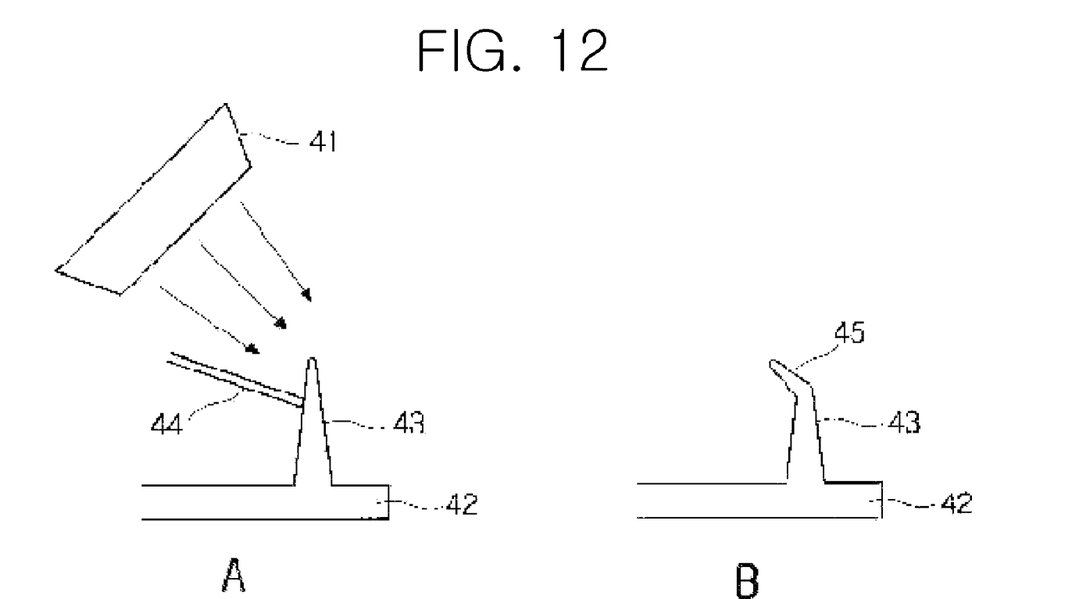
FIG. 12 schematically illustrates a process of manufacturing a CD-SPM probe by employing the deformation method of the nanometer-scale material using the particle beam according to an another embodiment of the present invention.

FIG. 12 is an another example of a CD-SPM probe manufactured by the deformation method of the nanometer-scale material using the particle beam according to the present invention. The unique aspect of the method shown in FIG. 12 different from the method shown in FIG. 11 is that it uses a mask to screen the particle beam. By using such a mask, a bending portion of the tip of the probe can be adjusted.

Specifically, as shown in FIG. 12A, a portion of a tip 43 protruding above a cantilever 42 of a probe is screened by a mask 44, then the particle beam is irradiated on upper part of a portion screened by the mask 44 using a ion column 41. Accordingly, the probe is bent except for the portion screened by the mask 44 as shown in FIG. 12B.

An another example of the nano-tool manufactured by the deformation method of the nanometer-scale material using the particle beam according to the present invention is a nano-hook.

Figure 13:
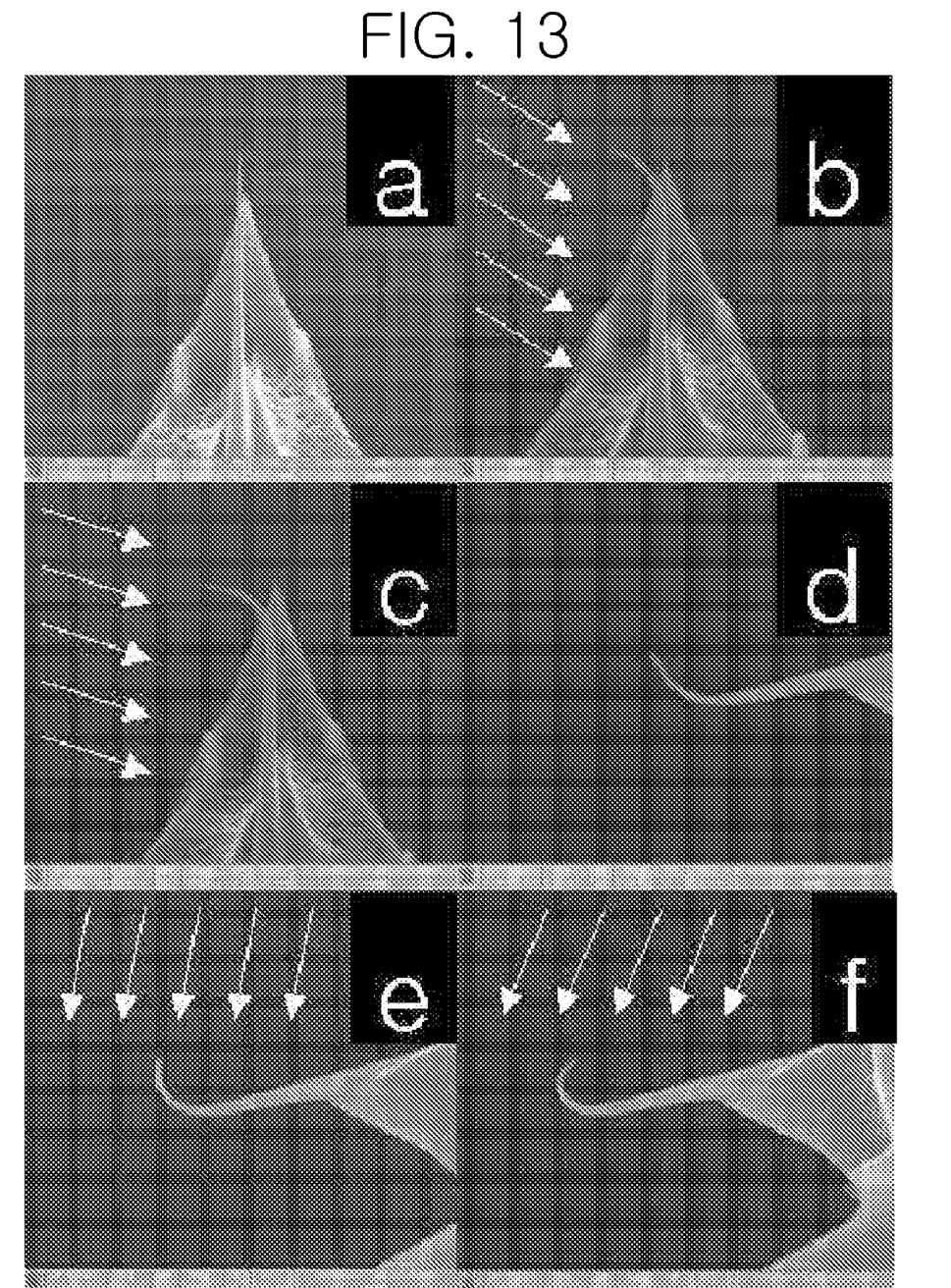
FIG. 13 is an SEM photograph showing a process of manufacturing a nano-hook manufactured by employing the deformation method of the nanometer-scale material using the particle beam according to the present invention.

FIG. 13 is an SEM photograph showing a manufacturing process of a nano-hook manufactured using the deformation method of the nanometer-scale material using the particle beam according to the present invention. An arrow mark in FIG. 12 indicates a direction in which the particle beam is irradiated.

FIG. 13a illustrates a nanometer-scale material in shape of a spike before the deformation by the particle. A nano-hook shown in FIG. 13f can be manufactured by going through processes of irradiating the particle beam as shown in FIGS. 13b through 13e.

Figure 14:
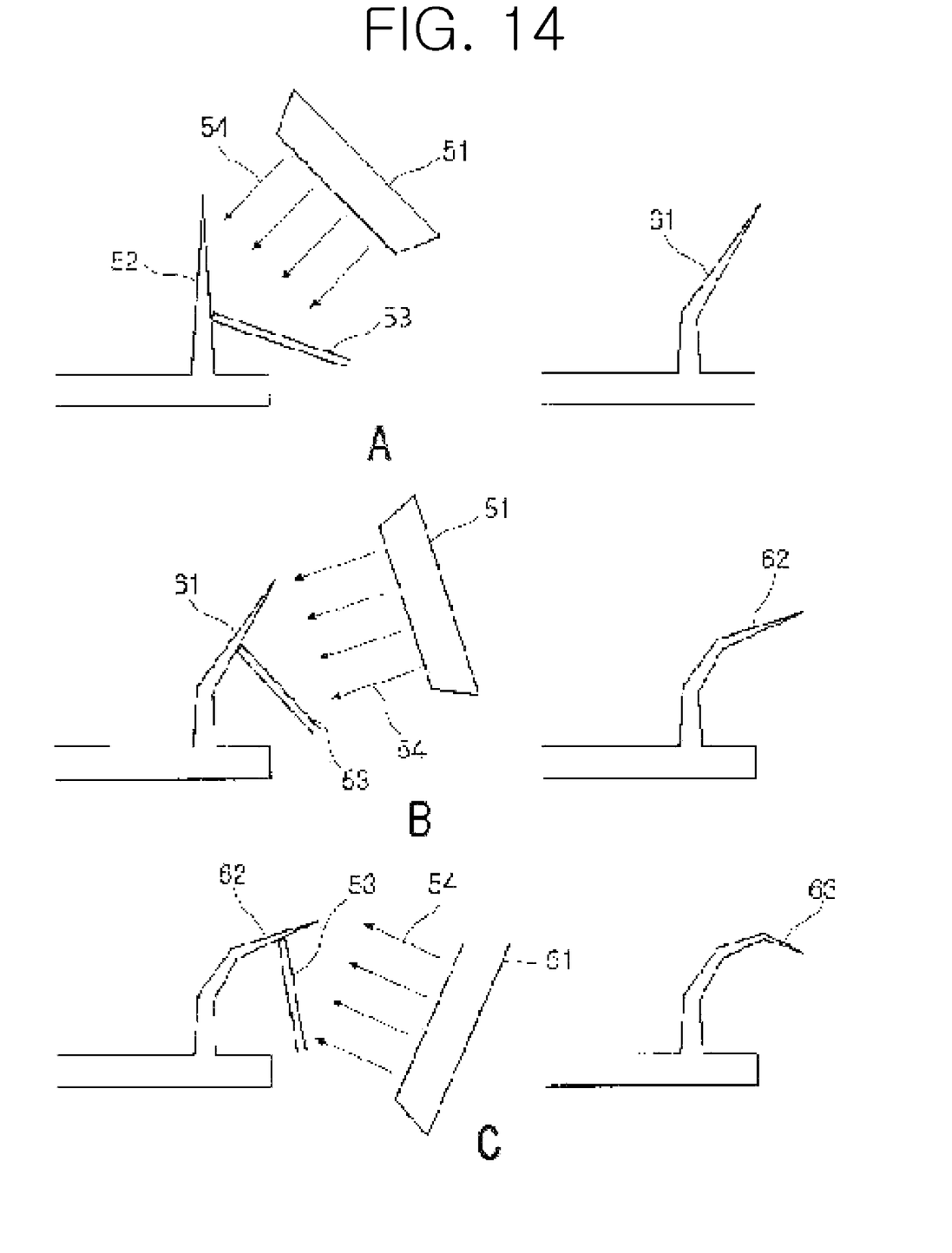
FIG. 14 schematically illustrates the process of manufacturing the nano-hook manufactured by employing the deformation method of the nanometer-scale material using the particle beam according to the present invention.

The nano-hook may be manufactured by employing a method of adjusting the time during which the nano-hook is exposed to the particle beam at each stage of b, c, d, and e, or by employing a method of using a mask as shown in FIG. 14.

Hereinafter, a process of manufacturing a nano-hook using the deformation method of the nanometer-scale material using the particle beam according to the present invention will be explained in reference with FIG. 14.

After a portion of a spike 52 constituting a protruding portion as shown in FIG. 14A is screened by a mask 53, particle beam 54 is irradiated on a portion exposed out of the mask 53 using an ion column 51. Then, as shown on right side of FIG. 14A, a portion 61 not screened by the mask 53 is bent toward a direction of the particle beam. Sequentially, a portion of a portion 61 bent in a stage shown in FIG. 14A is screened by the mask 54 again, and the particle beam 54 is irradiated on a portion exposed out of the mask 53 using the ion column 51. A result from the above stage is shown on right side of FIG. 14B. A portion 62 not screened by the mask 53 is bent by the particle beam. Lastly, in a stage shown in FIG. 14C, the portion 62 bent in a stage shown in FIG. 14B is screened by the mask 54 again, then the particle beam 54 is irradiated on a portion exposed out of the mask 53 using the ion column 51. Its result is shown on right side of FIG. 14C. Consequently, a portion 63 not screened by the mask 53 is bent by the particle beam.

The nano-hook having a desired shape can be manufactured by implementing such processes described above. Although the manufacturing process shown in FIG. 14 is described as having only 3 stages, the number of same repetitive stages can be increased in case where a situation requires, or in case of manufacturing a delicate nano-hook.

The CD-SPM probe or the nano-hook described above are examples of what can be manufactured by the deformation method of the nanometer-scale material using the particle beam according to the present invention. However, the nano-tools having various shapes can be manufactured by using the deformation method of the nanometer-scale material using the particle beam according to the present invention.

The present invention provides a method of easily deforming the nanometer-scale material having minuscule dimensions, by providing a deformation method of nanometer-scale material without applying mechanical force. Additionally, the present invention provides a nano-tool easily manufactured by using such a method.

Although a few embodiments of the present invention have been shown and described, it will be appreciated by those skilled in the art that changes may be made in these aspects without departing from the principles and spirit of the invention, the scope of which is defined in the appended claims and their equivalents.

What is claimed is:

1. A deformation method of nanometer-scale material using particle beam, which is characterized in that
the nanometer-scale material is bent toward a direction of the particle beam by irradiating the particle beam on the nanometer-scale material.

2. The deformation method of nanometer-scale material using particle beam according to claim 1, which is characterized in that
the particle beam may be one of neutron beam, proton beam, neutral atom beam, and ion beam.

3. The deformation method of nanometer-scale material using particle beam according to claim 2, which is characterized in that
the neutral atom is one of Helium(He), Boron(B), Neon(Ne), Magnesium(Mg), Aluminum(Al), Silicon(Si), Phosphor(P), Chlorine(Cl), Argon(Ar), Titanium(Ti), Chrome(Cr), Gallium(Ga), Germanium(Ge), Krypton(Kr), Indium(In), Xenon(Xe), Aurum(Au), and Platinum(Pt).

4. The deformation method of nanometer-scale material using particle beam according to claim 2, which is characterized in that
the ion is one of Helium(He), Boron(B), Neon(Ne), Magnesium(Mg), Aluminum(Al), Silicon(Si), Phosphor(P), Chlorine(Cl), Argon(Ar), Titanium(Ti), Chrome(Cr), Gallium(Ga), Germanium(Ge), Krypton(Kr), Indium(In), Xenon(Xe), Aurum(Au), and Platinum(Pt).

5. The deformation method of nanometer-scale material using particle beam according to claim 2, which is characterized in that
a thickness or a diameter of the nanometer-scale material on a portion where the particle is irradiated on is below 200 nm.

6. The deformation method of nanometer-scale material using particle beam according to claim 2, which is characterized in that
the nanometer-scale material is one of conductor, semiconductor, and insulator.

7. The deformation method of nanometer-scale material using particle beam according to claim 2, which is characterized in that
a shape of the nanometer-scale material is a bar or a protrusion.

8. The deformation method of nanometer-scale material using particle beam according to claim 7, which is characterized in that
by irradiating the particle beam after screening a portion of the bar or the protrusion with a mask, a portion of the protrusion exposed out of the mask is bent toward a direction of the particle beam.

9. A critical dimension scanning probe microscope (CD-SPM) probe manufactured by one of the deformation methods according to claim 1.

10. The critical dimension scanning probe microscope (CD-SPM) probe according to claim 9, which is characterized in that
by irradiating particle beam after screening a portion of a protrusion of the probe with a mask, a portion of the protrusion exposed out of the mask is bent toward a direction of the particle beam.

11. A nano-hook manufactured by one of the deformation methods according to claim 1.

12. The nano-hook according to claim 11, which is characterized in that
the nano-hook is manufactured by consecutively repeating a step of irradiating particle beam after screening a portion of a protrusion constituting the nano-hook with a mask, in order to bend a portion of the protrusion exposed out of the mask toward a direction of the particle beam.

* * * * *